United States Patent
Wang et al.

(10) Patent No.: US 9,318,218 B2
(45) Date of Patent: Apr. 19, 2016

(54) SHIFT REGISTER AND DRIVING CIRCUIT FOR LIQUID CRYSTAL DISPLAY

(71) Applicant: Century Technology (Shenzhen) Corporation Limited, Shenzhen (CN)

(72) Inventors: Ming-Tsung Wang, New Taipei (TW); Wen-Lin Mei, Shenzhen (CN); Hui Wang, Shenzhen (CN); Chia-Hua Huang, New Taipei (TW)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 15 days.

(21) Appl. No.: 14/301,495

(22) Filed: Jun. 11, 2014

(65) Prior Publication Data

US 2014/0362067 A1 Dec. 11, 2014

(30) Foreign Application Priority Data

Jun. 11, 2013 (CN) .......................... 2013 1 02302745

(51) Int. Cl.
*G09G 3/36* (2006.01)
*G11C 19/28* (2006.01)

(52) U.S. Cl.
CPC .............. *G11C 19/28* (2013.01); *G09G 3/3677* (2013.01); *G09G 2310/0286* (2013.01); *G09G 2320/0219* (2013.01)

(58) Field of Classification Search
CPC .............. G09G 3/30; G09G 5/00; G06F 3/038
See application file for complete search history.

(56) References Cited

U.S. PATENT DOCUMENTS

| | | | |
|---|---|---|---|
| 2007/0274433 A1* | 11/2007 | Tobita | G11C 19/28 377/64 |
| 2011/0044423 A1* | 2/2011 | Lin | G09G 3/32 377/64 |
| 2011/0058642 A1* | 3/2011 | Tsai | G09G 3/3677 377/79 |
| 2011/0216877 A1* | 9/2011 | Hsu | G11C 19/00 377/79 |
| 2011/0234577 A1* | 9/2011 | Yang | G09G 3/3677 345/212 |
| 2012/0008731 A1* | 1/2012 | Hsu | G11C 19/28 377/79 |

\* cited by examiner

*Primary Examiner* — Pegeman Karimi
(74) *Attorney, Agent, or Firm* — Novak Druce Connolly Bove + Quigg LLP

(57) ABSTRACT

A shift register for an LCD display includes N shift register units. Each shift register unit outputs a shift signal. An $N^{th}$ shift register unit includes a waveform-shaping unit electrically coupled to an shift signal output terminal of the $N^{th}$ register to perform a waveform-shaping operation on the Nth shift signal according to the $(N+1)^{th}$ shift signal output by an $(N+1)^{th}$ shift register, to reduce the feed-through effect which causes display flicker.

16 Claims, 5 Drawing Sheets

SHIFT REGISTER AND DRIVING CIRCUIT FOR LIQUID CRYSTAL DISPLAY

CROSS-REFERENCE TO RELATED APPLICATIONS

This application claims priority to Chinese Patent Application No. 201310230274.5 filed on Jun. 11, 2013 in the China Intellectual Property Office, the contents of which are incorporated by reference herein.

FIELD

The disclosure generally relates to shift registers, and more particularly to a shift register in a driving circuit for a liquid crystal display (LCD).

BACKGROUND

An LCD panel usually employs a scanning driving circuit and a data driving circuit to provide scanning signals and display data signals, respectively. A shift register is an important component of both the data driving circuit and the scanning driving circuit. Generally, the shift register includes a plurality of shift register units coupled one by one. In the operation of the shift register circuit, the shift register provides the gate signals having periodical pulses to pixel units of the LCD panel for writing the data signals which become pixel voltages of the pixel units. However, each pulse of the gate signals is substantially a square waveform signal, and a falling edge of each pulse may cause an occurrence of pulling down the written pixel voltages due to the coupling effect of the parasitic capacitors corresponding to the pixel units. This phenomenon is referred to as the feed-through effect. The feed-through effect is likely to cause image flicker, and the display quality of liquid crystal displays using the shift register circuit is therefore degraded.

BRIEF DESCRIPTION OF THE DRAWINGS

Implementations of the present technology will now be described, by way of example only, with reference to the attached figures.

DETAILED DESCRIPTION

Figure 1:
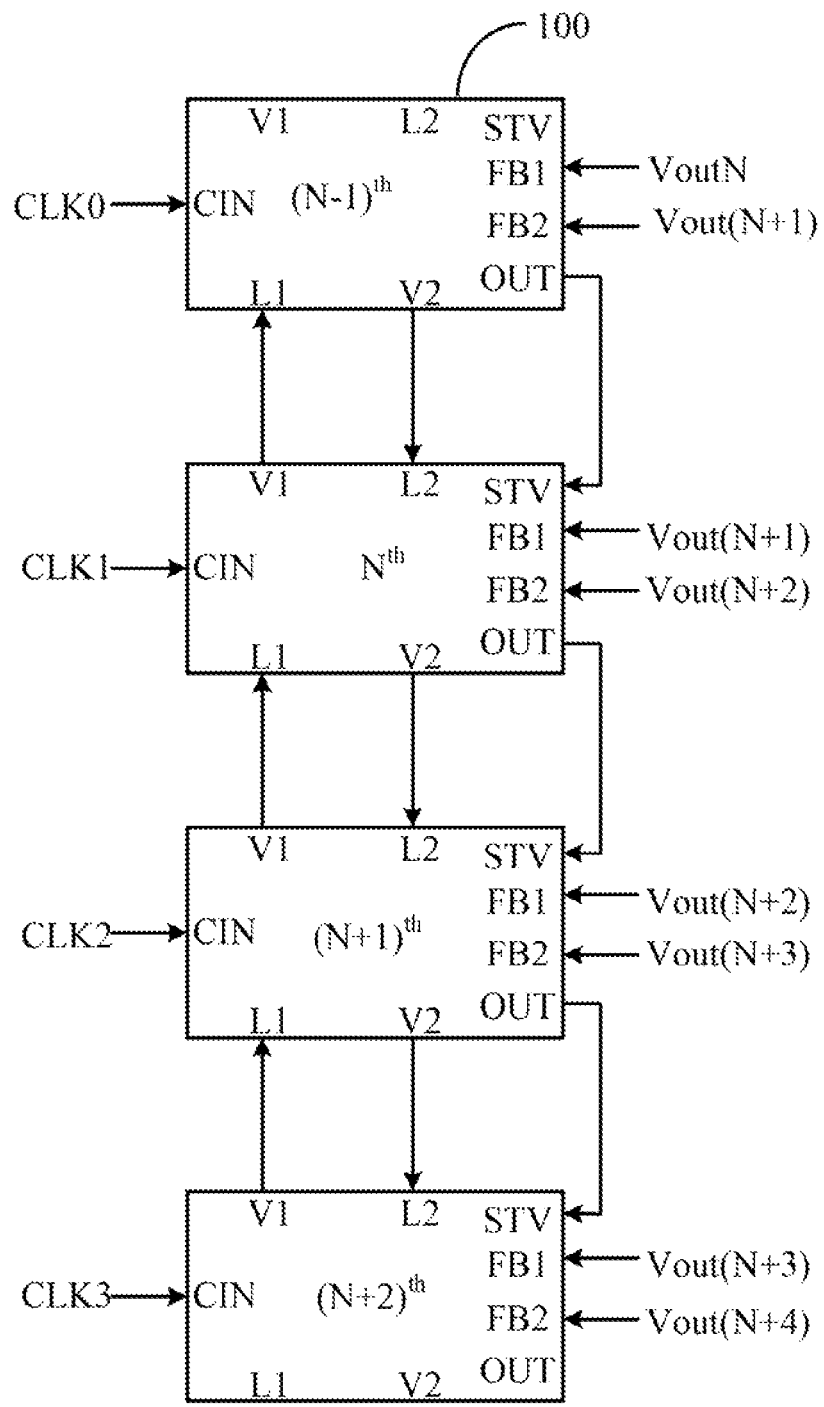
FIG. 1 is a block diagram of a shift register including a plurality of shift register units according to an exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Referring to FIG. 1, a shift register 10 can include a plurality of shift register units 100. The shift register units 100 sequentially output a plurality of first shift signals, namely Vout1, Vout2, Vout3 . . . Vout(N−1), VoutN, Vout(N+1), Vout (N+2) . . . , wherein N is a natural number.

Figure 2:
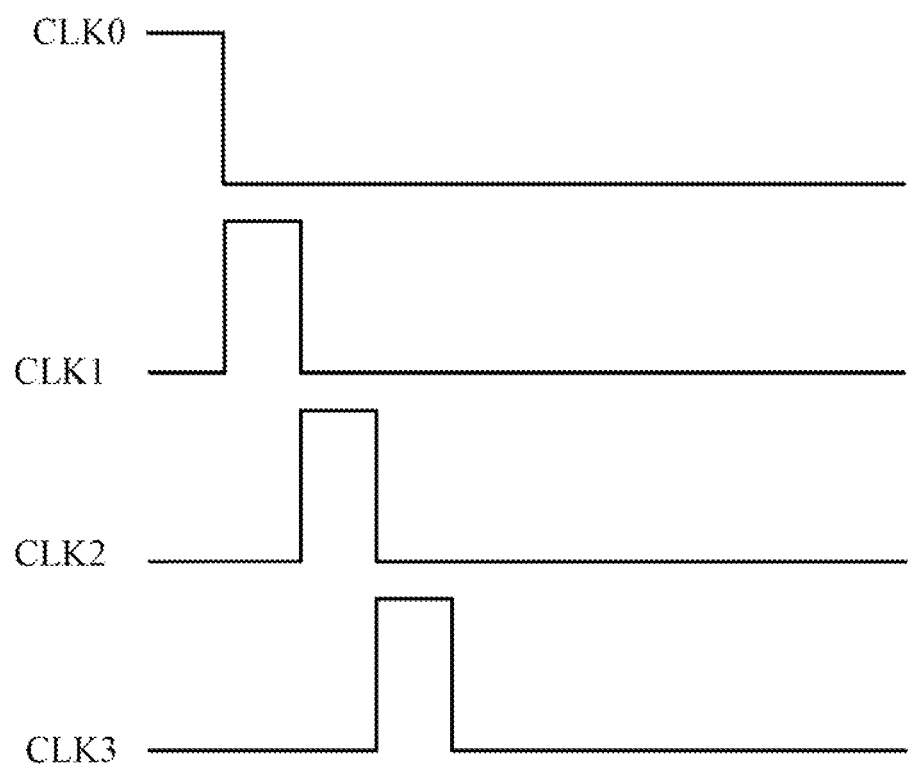
FIG. 2 is a waveform diagram of exemplary clock signals of the shift register of FIG. 1.

Each shift register unit 100 can include a clock signal input terminal CIN, a starting signal input terminal STV, a shift signal output terminal OUT, a first cascade signal output terminal V1, a first cascade signal input terminal L1, a second cascade signal output terminal V2, a second cascade signal input terminal L2, a first feedback terminal FB1, and a second feedback terminal FB2. The clock signal input terminal CIN receives a clock signal. Each of the four shift register units 100 receive different clock signals. For example, in this exemplary embodiment, the $(N-1)^{th}$, $N^{th}$, $(N+1)^{th}$, and $(N+2)^{th}$ shift register units 100 receive different clock signals, as shown in FIG. 2.

In at least one embodiment, the clock signal input terminal CIN of the $N^{th}$ shift register unit 100 receives a first clock signal CLK1. The first cascade signal output terminal V1 of the Nth shift register unit 100 is electrically coupled to the first cascade signal input terminal L1 of the $(N-1)^{th}$ shift register unit 100. The second cascade signal input terminal L2 of the $N^{th}$ shift register unit 100 is electrically coupled to the second cascade signal output terminal V2 of the $(N-1)^{th}$ shift register unit 100. The first cascade signal input terminal L1 of the Nth shift register unit 100 is electrically coupled to the first cascade signal output terminal V1 of the $(N+1)^{th}$ shift register unit 100. The second cascade signal output terminal V2 of the Nth shift register unit 100 is electrically coupled to the second cascade signal input terminal L2 of the $(N+1)^{th}$ shift register unit 100. The starting signal input terminal STV of the Nth shift register unit 100 is electrically coupled to the shift signal output terminal OUT of the $(N-1)^{th}$ shift register unit 100. The $(N-1)^{th}$ shift signal Vout(N−1) is a starting signal of the $N^{th}$ shift register unit 100 which is configured to start the Nth shift register unit 100. The shift signal output terminal OUT of the $N^{th}$ shift register unit 100 is electrically coupled to the starting signal input terminal STV of the (N+1)$^{th}$ shift register unit 100. The first feedback terminal FB1 of the Nth shift register unit 100 is electrically coupled to the shift signal output terminal OUT of the $(N+1)^{th}$ shift register unit 100, and the $(N+1)^{th}$ shift signal Vout(N+1) output by the $(N+1)^{th}$ shift register unit 100 is defined as a first feedback signal. The second feedback terminal FB2 of the $N^{th}$ shift register unit 100 is electrically coupled to the shift signal output terminal OUT of the $(N+2)^{th}$ shift register unit 100, and the $(N+2)^{th}$ shift signal Vout(N+2) output by the $(N+2)^{th}$ shift register unit 100 is defined as a second feedback signal.

Figure 3:
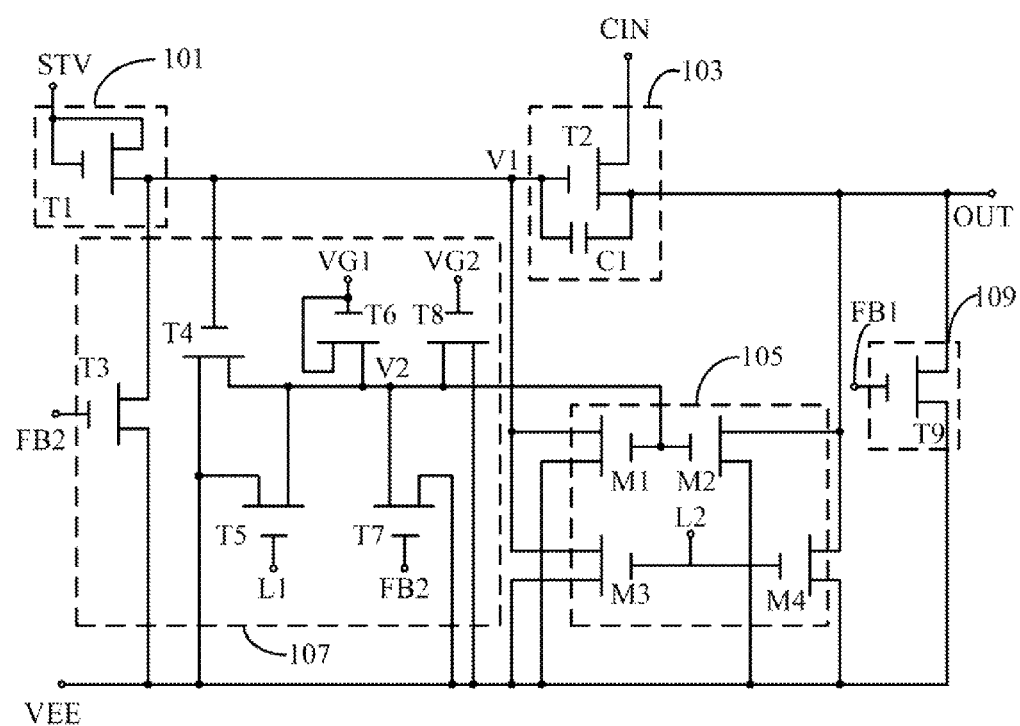
FIG. 3 is a circuit diagram of an $N^{th}$ shift register of FIG. 1.

Referring to FIG. 3, the $N^{th}$ shift register unit 100 can include a starting unit 101, a pull-up unit 103, a pull-down unit 105, a control unit 107, and a waveform-shaping unit 109. The starting unit 101 outputs a first driving signal to the pull-up unit 103 according to the starting signal. The pull-up unit 103 is electrically coupled between the starting unit 101 and the shift signal output terminal OUT. The pull-up unit 103 pulls up the value of the shift signal VoutN according to the first driving signal and the first clock signal CLK1. The pull-down unit 105 is electrically coupled between the starting unit 101 and the shift signal output terminal OUT to pull down the value of the first driving signal. The control unit 107 is electrically coupled between the starting unit and the pull-down unit 105 to control a working time of the pull-down unit 105 according to the $(N+2)^{th}$ shift signal, a first control signal VG1, and a second control signal VG2. In the embodiment, the first control signal VG1 and the second control signal VG2 are both output by an external controller. The waveform-shaping unit 109 is electrically coupled to the shift signal output terminal OUT to perform a waveform-shaping operation on the Nth shift signal VoutN under the control of the $(N+1)^{th}$ shift signal.

The starting unit 101 can include a first transistor T1. A gate electrode of the first transistor T1 is electrically coupled to the starting signal input terminal STV and a source electrode of the first transistor T1.

The pull-up unit 103 can include a second transistor T2 and a first capacitor C1. A gate electrode of the second transistor T2 is electrically coupled to a drain electrode of the first transistor T1. The first capacitor C1 is electrically coupled between the gate electrode of the second transistor T2 and a drain electrode of the second transistor T2. A source electrode of the second transistor T2 is electrically coupled to the clock signal input terminal CIN to receive the first clock signal CLK1. The gate electrode of the second transistor T2 is electrically coupled to the first cascade signal output terminal V1 of the Nth shift register unit 100.

The pull-down unit 105 can include a first pull-down transistor M1, a second pull-down transistor M2, a third pull-down transistor M3, and a fourth pull-down transistor M4. A gate electrode of the first pull-down transistor M1 is electrically coupled to a gate electrode of the second pull-down transistor M2. Source electrodes of the first and third pull-down transistors M1 and M3 are electrically coupled to the gate electrode of the second transistor T2. Source electrodes of the second and fourth pull-down transistors M2 and M4 are electrically coupled to the shift signal output terminal OUT. Drain electrodes of the first, second, third, and fourth pull-down transistors, M1, M2, M3, and M4, receive a logic-low signal provided by an external power source. A node between the gate electrode of the third pull-down transistor M3 and the gate electrode of the fourth pull-down transistor M4 is electrically coupled to the second cascade signal input terminal L2 of the $N^{th}$ shift register unit 100.

The control unit 107 can include a third transistor T3, a fourth transistor T4, a fifth transistor T5, a sixth transistor T6, a seventh transistor T7, and an eighth transistor T8. A gate electrode of the third transistor T3 is the second feedback terminal FB2 of the $N^{th}$ shift register unit 100. A source electrode of the third transistor T3 is electrically coupled to the drain electrode of the first transistor T1. A drain electrode of the third transistor T3 receives the logic-low signal VEE. In the embodiment, the drain electrode of the third transistor T3 is grounded. A gate electrode of the fourth transistor T4 is electrically coupled to the drain electrode of the first transistor T1, and a drain electrode of the fourth transistor T4 receives the logic-low signal VEE. A source electrode of the fourth transistor T4 is electrically coupled to the source electrodes of the fifth, sixth, seventh, and eighth transistors, T5-T8. The source electrodes of the fourth, fifth, sixth, seventh, and eighth transistors, T4-T8, receive the logic-low signal VEE. A gate electrode of the sixth transistor T6 is electrically coupled to the source electrode of the sixth transistor T6. The gate electrode of the sixth transistor T6 receives the first control signal VG1 from the external controller, and a gate electrode of the eighth transistor T8 receives the second control signal VG2 from the external controller. A gate electrode of the fifth transistor T5 is electrically coupled to the first cascade signal input terminal L1. The gate electrode of the fifth transistor T5 is electrically coupled to the first cascade signal output terminal V1 of the $(N+1)^{th}$ shift register unit 100. A gate of the seventh transistor T7 is electrically coupled to the second feedback terminal FB2 to receive the $(N+2)^{th}$ shift signal output by the $(N+2)^{th}$ shift register unit 100. A node between the drain electrode of the sixth transistor T6 and the drain electrode of the eighth transistor T8 is electrically coupled to the second cascade signal output terminal V2 of the Nth shift register unit 100. In the embodiment, a ratio of width and length of a channel layer of the sixth transistor T6 is 100 times greater than a ratio of width and length of a channel layer of the eighth transistor T8. A ratio of width and length of a channel layer of fifth transistor T5 is 100 times greater than a ratio of width and length of a channel layer of the eighth transistor T8.

The waveform-shaping unit 109 can include a ninth transistor T9. A gate electrode of the ninth transistor T9 can be electrically coupled to the first feedback terminal FB1 of the Nth shift register unit 100 to receive the $(N+1)^{th}$ shift signal output by the $(N+1)^{th}$ shift register unit 100. A source electrode of the ninth transistor T9 can be electrically coupled to the shift signal output terminal OUT, and a drain electrode of the ninth transistor T9 to receive the logic-low signal VEE.

Figure 4:
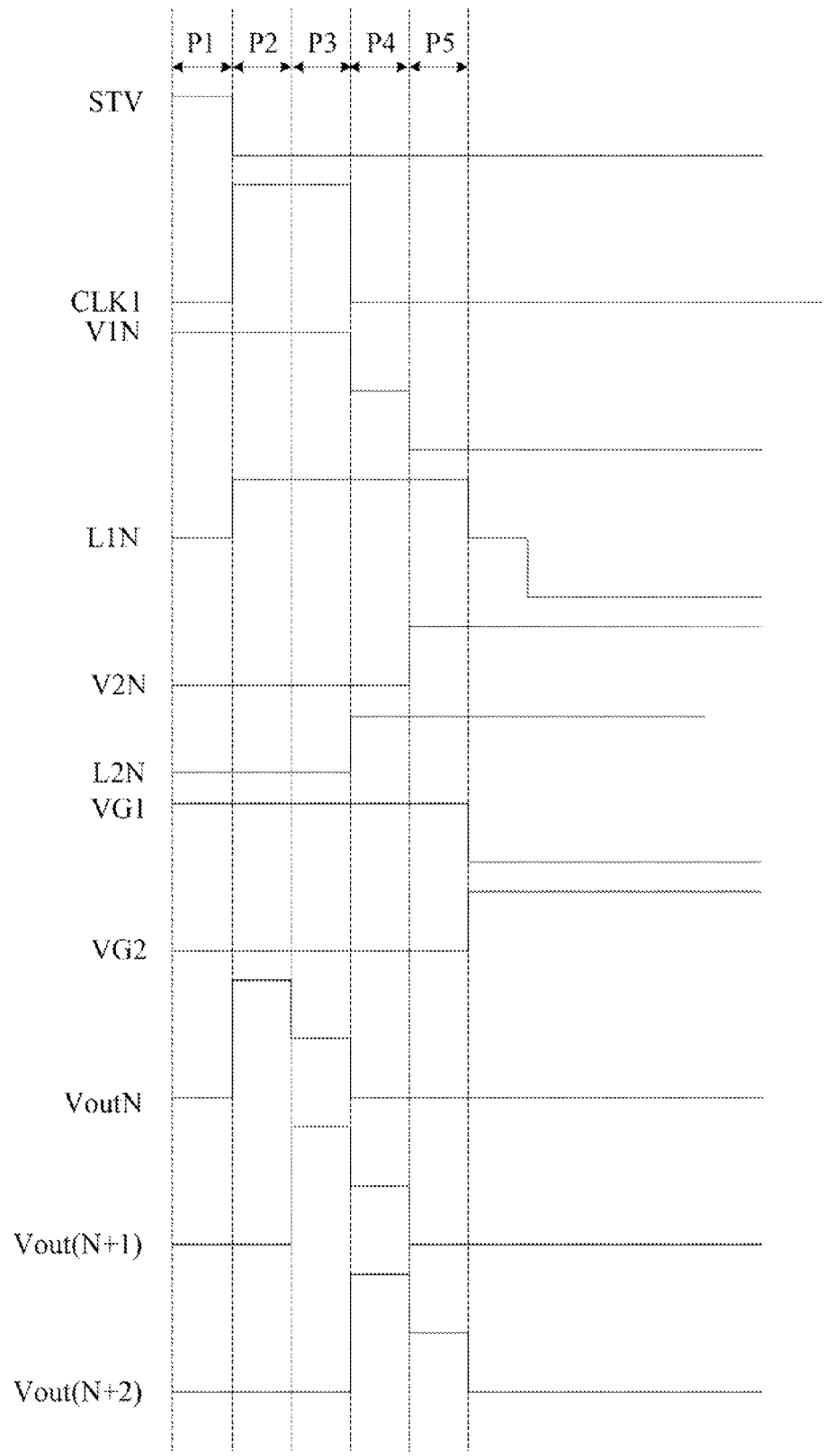
FIG. 4 is a diagram of sequential waveforms of exemplary pulse signals of the $N^{th}$ shift register of FIG. 3.

Referring to FIG. 4, VIN represents a first cascade output signal output by the first cascade signal output terminal V1 of the $N^{th}$ shift register unit 100. L1N represents a first cascade input signal to be transmitted to the first cascade signal input terminal L1 of the $N^{th}$ shift register unit 100. V2N represents a second cascade output signal output by the second cascade signal output terminal V2 of the $N^{th}$ shift register unit 100. L2N represents a second cascade input signal to be transmitted to the second cascade signal input terminal L2 of the $N^{th}$ shift register unit 100.

During a first period P1, the starting signal STV is at logic-high, the first clock signal CLK1 is logic-low, the first control signal VG1 is at logic-high, and the second control signal VG2 is at logic-low. The first transistor T1 and the second transistor T2 are both turned on under control of the starting signal STV and the first control signal VG1. The first clock signal CLK1 is output by the shift signal output terminal OUT, thus the $N^{th}$ shift signal VoutN is at logic-low. The first capacitor C1 is charged by the starting signal STV, and the first cascade output signal V1N is at logic-high. In the control unit 107, the fourth transistor T4 and the sixth transistor T6 are turned on, the second cascade output signal V2N is at logic-low, thus the first and second pull-down transistors M1 and M2 are turned off.

During a second period P2, the starting signal STV changes to a logic-low to turn off the first transistor T1 from the logic-high and the first clock signal CLK1 changes from a logic-low to a logic-high. The first cascade signal output terminal V1 is at logic-high because of the existence of the first capacitor C1. In the control unit 107, the fourth transistor T4 and the sixth transistor T6 are turned on, the second cascade output signal V2N is at logic-low to turn off the first and second pull-down transistors M1 and M2.

During a third period P3, the starting signal STV is at logic-low and the first transistor T1 is turned off. The first cascade signal output terminal V1 is at logic-high because of the existence of the first capacitor C1. The $(N+1)^{th}$ shift signal Vout(N+1) is at logic-high to turn on the ninth transistor T9, and the logic-low signal VEE performs a waveform-shaping operation on the $N^{th}$ shift signal VoutN to pull it down.

During a fourth period P4, the $(N+2)^{th}$ shift signal Vout(N+2) is at logic-high, and the third transistor T3 is turned on, the first cascade output signal V1N changes from a logic-high to a logic-low to turn off the second transistor T2 and the fourth transistor T4. The first transistor T1 is turned on. The second cascade output signal V2N is at logic-low.

During a fifth period P5, the first cascade input signal L1N changes from a logic-high to a logic-low, and the second cascade output signal V2N is at logic-high, thus the first and second pull-down transistors M1 and M2 are turned on and the first cascade output signal V1N changes from a logic-high to a logic-low.

Figure 5:
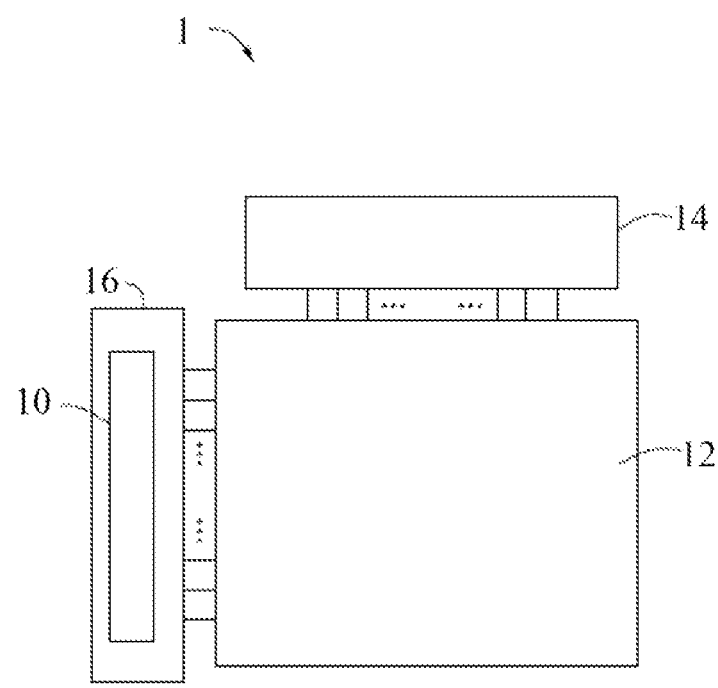
FIG. 5 is a block diagram of a liquid crystal display including the shift register of FIG. 1.

Referring to FIG. 5, a liquid crystal display 1 can include a liquid crystal panel 12, a data driver 14, and a gate driver 16. The gate driver 16 outputs a plurality of gate signals to control a working state of a plurality of thin film transistors of the liquid crystal panel 12. The data driver 14 outputs a plurality of data signals to the liquid crystal panel 12. The gate driver 16 controls a timing sequence of the gate signals through the shift register 100.

It is to be understood that even though numerous characteristics and advantages of the present embodiments have been set forth in the foregoing description, with details of the structures and functions of the embodiments, the disclosure is illustrative only; and changes may be in detail, including in the matter of arrangement of parts within the principles of the embodiments to the full extent indicated by the broad general meaning of the terms in which the appended claims are expressed.

What is claimed is:

1. A shift register comprising:
a plurality of shift register units, each shift register unit outputting a shift signal, an $N^{th}$ shift register unit comprising:
a starting unit electrically coupled to an $(N-1)^{th}$ shift register and outputting a first driving signal according to an $(N-1)^{th}$ shift signal output by an $(N-1)^{th}$ shift register;
a pull-up unit electrically coupled between the starting unit and a shift signal output terminal of the $N^{th}$ shift register unit and pulling up an $N^{th}$ shift signal output by an $N^{th}$ shift register according to the first driving signal and a first clock signal;
a pull-down unit electrically coupled between the starting unit and the shift signal output terminal of the $N^{th}$ shift register unit and pulling down the first driving signal;
a control unit electrically coupled between the starting unit and the pull-down unit to control a working time of the pull-down unit according to an $(N+2)^{th}$ shift signal, a first control signal, and a second control signal; and
a waveform-shaping unit electrically coupled to the shift signal output terminal of the $N^{th}$ register to perform a waveform-shaping operation on the $N^{th}$ shift signal according to the $(N+1)^{th}$ shift signal;
wherein each of the shift register units comprises a first cascade signal output terminal, a first cascade signal input terminal, a second cascade signal input terminal, a second cascade signal output terminal, a first feedback terminal, and a second feedback terminal; the first cascade signal output terminal of the $N^{th}$ shift register unit is electrically coupled to the first cascade signal output terminal of an $(N+1)^{th}$ shift register unit, the first cascade signal output terminal of the $N^{th}$ shift register unit is electrically coupled to the first cascade signal input terminal of the $(N-1)^{th}$ shift register unit, the second cascade signal output terminal of the $N^{th}$ shift register unit is electrically coupled to the second cascade signal input terminal of the $(N-1)^{th}$ shift register unit, the first feedback terminal of the $N^{th}$ shift register unit receives the $(N+1)^{th}$ shift signal, and the second feedback terminal of the $N^{th}$ shift register unit receives the $(N+2)^{th}$ shift signal.

2. The shift register of claim 1, wherein the starting unit comprises a first transistor, and a gate electrode of the first transistor is electrically coupled to the starting signal input terminal STV and a source electrode of the first transistor.

3. The shift register of claim 2, wherein the pull-up unit comprises a second transistor and a first capacitor, a gate electrode of the second transistor is electrically coupled to a drain electrode of the first transistor; the first capacitor is electrically coupled between the gate electrode of the second transistor and a drain electrode of the second transistor, a source electrode of the second transistor is electrically coupled to the clock signal input terminal to receive the first clock signal.

4. The shift register of claim 3, wherein the gate electrode of the second transistor is electrically coupled to the first cascade signal output terminal of the $N^{th}$ shift register.

5. The shift register of claim 3, wherein the pull-down unit comprises a first pull-down transistor, a second pull-down transistor, a third pull-down transistor, and a fourth pull-down transistor, a gate electrode of the first pull-down transistor is electrically coupled to a gate electrode of the second pull-down transistor, source electrodes of the first and third pull-down transistors and are electrically coupled to the gate of the second transistor, and source electrodes of the second and fourth pull-down transistors are electrically coupled to the shift signal output terminal, and drain electrodes of the first, second, third, and fourth pull-down transistor receive a logic-low signal provided by an external power source.

6. The shift register of claim 5, wherein a node between the gate electrode of the third pull-down transistor and the gate electrode of the fourth pull-down transistor is electrically coupled to the second cascade signal input terminal of the $N^{th}$ shift register unit.

7. The shift register of claim 5, wherein the control unit comprises third, fourth, fifth, sixth, seventh, and eighth transistors, and a gate of the third transistor is electrically coupled to the second feedback terminal of the $N^{th}$ shift register unit, and a source electrode of the third transistor is electrically coupled to the drain electrode of the first transistor, a drain electrode of the third transistor receives the logic-low signal; a gate electrode of the fourth transistor is electrically coupled to the drain electrode of the first transistor; a drain electrode of the fourth transistor receives the logic-low signal, and a source electrode of the fourth transistor is electrically coupled to source electrodes of the fifth, sixth, seventh, and eighth transistors, the source electrodes of the fourth, fifth, seventh, and eighth transistors receive the logic-low signal, a gate electrode of the sixth transistor is electrically coupled to the source electrode of the sixth transistor, the gate electrode of the sixth transistor receives the first control signal; and a gate electrode of the eighth transistor receives the second control signal, a gate electrode of the fifth transistor is electrically coupled to the first cascade signal input terminal and the first cascade signal output terminal of the $(N+1)^{th}$ shift register unit, a gate electrode of the seventh transistor is electrically coupled to the second feedback terminal to receive the $(N+2)^{th}$ shift signal output by the $(N+2)^{th}$ shift register unit; and a node between the drain electrode of the sixth transistor and the drain electrode of the eighth transistor is electrically coupled to the second cascade signal output terminal of the Nth shift register unit.

8. The shift register of claim 7, wherein the waveform-shaping unit comprises a ninth transistor, a gate electrode of the ninth transistor is electrically coupled to the first feedback terminal of the $N^{th}$ shift register unit to receive the $(N+1)^{th}$ shift signal output by the $(N+1)^{th}$ shift register unit, a source electrode of the ninth transistor is electrically coupled to the shift signal output terminal, and a drain electrode of the ninth transistor receives the logic-low signal.

9. A liquid crystal display comprising:
a display panel, a date driver, and a gate driver;
the gate driver comprising a shift register comprising:
a plurality of shift register units, each shift register unit outputting a shift signal, an Nth shift register unit comprising:
a staring starting unit electrically coupled to an $(N-1)^{th}$ shift register and outputting a first driving signal according to an $(N-1)^{th}$ shift signal output by an $(N-1)^{th}$ shift register;
a pull-up unit electrically coupled between the starting unit and a shift signal output terminal of the $N^{th}$ shift register unit and pulling up an $N^{th}$ shift signal output by an $N^{th}$ shift register according to the first driving signal and a first clock signal;
a pull-down unit electrically coupled between the starting unit and a shift signal output terminal of the $N^{th}$ shift register unit and pulling down the first driving signal;
a control unit electrically coupled between the starting unit and the pull-down unit to control a working time of the pull-down unit according to an $(N+2)^{th}$ shift signal, a first control signal, and a second control signal; and
a waveform-shaping unit electrically coupled to the shift signal output terminal of the $N^{th}$ register to perform a waveform-shaping operation on the Nth shift signal according to the $(N+1)^{th}$ shift signal;
wherein each of the shift register units comprises a first cascade signal output terminal, a first cascade signal input terminal, a second cascade signal input terminal, a second cascade signal output terminal, a first feedback terminal, and a second feedback terminal; the first cascade signal output terminal of the $N^{th}$ shift register unit is electrically coupled to the first cascade signal output terminal of an $(N+1)^{th}$ shift register unit, the first cascade signal output terminal of the $N^{th}$ shift register unit is electrically coupled to the first cascade signal input terminal of the $(N-1)^{th}$ shift register unit, the second cascade signal output terminal of the $N^{th}$ shift register unit is electrically coupled to the second cascade signal input terminal of the $(N-1)^{th}$ shift register unit, the first feedback terminal of the $N^{th}$ shift register unit receives the $(N+1)^{th}$ shift signal, and the second feedback terminal of the $N^{th}$ shift register unit receives the $(N+2)^{th}$ shift signal.

10. The liquid crystal display of claim 9, wherein the starting unit comprises a first transistor, and a gate electrode of the first transistor is electrically coupled to the starting signal input terminal STV and a source electrode of the first transistor.

11. The liquid crystal display of claim 10, wherein the pull-up unit comprises a second transistor and a first capacitor, a gate electrode of the second transistor is electrically coupled to a drain electrode of the first transistor; the first capacitor is electrically coupled between the gate electrode of the second transistor and a drain electrode of the second transistor, a source electrode of the second transistor is electrically coupled to the clock signal input terminal to receive the first clock signal.

12. The liquid crystal display of claim 11, wherein the gate electrode of the second transistor is electrically coupled to the first cascade signal output terminal of the $N^{th}$ shift register.

13. The liquid crystal display of claim 11, wherein the pull-down unit comprises a first pull-down transistor, a second pull-down transistor, a third pull-down transistor, and a fourth pull-down transistor, a gate electrode of the first pull-down transistor is electrically coupled to a gate electrode of the second pull-down transistor, source electrodes of the first and third pull-down transistors and are electrically coupled to the gate of the second transistor, and source electrodes of the second and fourth pull-down transistors are electrically coupled to the shift signal output terminal, and drain electrodes of the first, second, third, and fourth pull-down transistor receive a logic-low signal provided by an external power source.

14. The liquid crystal display of claim 13, wherein a node between the gate electrode of the third pull-down transistor and the gate electrode of the fourth pull-down transistor is electrically coupled to the second cascade signal input terminal of the $N^{th}$ shift register unit.

15. The liquid crystal display of claim 13, wherein the control unit comprises third, fourth, fifth, sixth, seventh, and eighth transistors, and a gate of the third transistor is electrically coupled to the second feedback terminal of the $N^{th}$ shift register unit, and a source electrode of the third transistor is electrically coupled to the drain electrode of the first transistor, a drain electrode of the third transistor receives the logic-low signal; a gate electrode of the fourth transistor is electrically coupled to the drain electrode of the first transistor; a drain electrode of the fourth transistor receives the logic-low signal, and a source electrode of the fourth transistor is electrically coupled to source electrodes of the fifth, sixth, seventh, and eighth transistors, the source electrodes of the fourth, fifth, seventh, and eighth transistors receive the logic-low signal, a gate electrode of the sixth transistor is electrically coupled to the source electrode of the sixth transistor, the gate electrode of the sixth transistor receives the first control signal; and a gate electrode of the eighth transistor receives the second control signal, a gate electrode of the fifth transistor is electrically coupled to the first cascade signal input terminal and the first cascade signal output terminal of the $(N+1)^{th}$ shift register unit, a gate electrode of the seventh transistor is electrically coupled to the second feedback terminal to receive the $(N+2)^{th}$ shift signal output by the $(N+2)^{th}$ shift register unit; and a node between the drain electrode of the sixth transistor and the drain electrode of the eighth transistor is electrically coupled to the second cascade signal output terminal of the Nth shift register unit.

16. The liquid crystal display of claim 15, wherein the waveform-shaping unit comprises a ninth transistor, a gate electrode of the ninth transistor is electrically coupled to the first feedback terminal of the $N^{th}$ shift register unit to receive the $(N+1)^{th}$ shift signal output by the $(N+1)^{th}$ shift register unit, a source electrode of the ninth transistor is electrically coupled to the shift signal output terminal, and a drain electrode of the ninth transistor receives the logic-low signal.

* * * * *